(12) United States Patent
Ishiguro et al.

(10) Patent No.: US 9,997,594 B2
(45) Date of Patent: Jun. 12, 2018

(54) GALLIUM NITRIDE BASED HIGH ELECTRON MOBILITY TRANSISTOR (GAN-HEMT) DEVICE WITH AN IRON-DOPED CAP LAYER AND METHOD OF MANUFACTURING THE SAME

(71) Applicant: FUJITSU LIMITED, Kawasaki-shi, Kanagawa (JP)

(72) Inventors: Tetsuro Ishiguro, Kawasaki (JP); Atsushi Yamada, Isehara (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/272,993

(22) Filed: Sep. 22, 2016

(65) Prior Publication Data

US 2017/0125516 A1    May 4, 2017

(30) Foreign Application Priority Data

Oct. 29, 2015 (JP) .................................. 2015-213329

(51) Int. Cl.
| | |
|---|---|
| H01L 29/15 | (2006.01) |
| H01L 31/0256 | (2006.01) |
| H01L 29/06 | (2006.01) |
| H01L 29/20 | (2006.01) |
| H01L 29/205 | (2006.01) |
| H01L 29/66 | (2006.01) |
| H01L 29/778 | (2006.01) |
| H02M 3/335 | (2006.01) |
| H03F 1/32 | (2006.01) |
| H03F 3/19 | (2006.01) |
| H03F 3/21 | (2006.01) |

(52) U.S. Cl.
CPC ...... *H01L 29/0638* (2013.01); *H01L 29/2003* (2013.01); *H01L 29/205* (2013.01); *H01L 29/66462* (2013.01); *H01L 29/7787* (2013.01); *H02M 3/33507* (2013.01); *H03F 1/3241* (2013.01); *H03F 3/19* (2013.01); *H03F 3/21* (2013.01); *H03F 2200/333* (2013.01)

(58) Field of Classification Search
CPC ............. H01L 29/0638; H01L 29/7787; H01L 29/66462; H01L 29/205; H01L 29/2003; H03F 3/21; H03F 3/19; H03F 1/3241; H02M 3/33507
See application file for complete search history.

(56) References Cited

U.S. PATENT DOCUMENTS

| | | | |
|---|---|---|---|
| 2013/0256683 A1* | 10/2013 | Imanishi ............... | H01L 29/778 257/76 |
| 2014/0091313 A1 | 4/2014 | Kotani et al. | |
| 2017/0301781 A1* | 10/2017 | Boles .................. | H01L 29/0653 |

FOREIGN PATENT DOCUMENTS

| | | |
|---|---|---|
| JP | 2012-028706 | 2/2012 |
| JP | 2014-072430 | 4/2014 |

* cited by examiner

*Primary Examiner* — Alexander Sofocleous
*Assistant Examiner* — Vicki B Booker
(74) *Attorney, Agent, or Firm* — Fujitsu Patent Center

(57) ABSTRACT

A compound semiconductor device includes: a GaN-based channel layer; a barrier layer of nitride semiconductor above the channel layer; and a cap layer of nitride semiconductor above the barrier layer, wherein the cap layer includes: a first region doped with Fe; and a second region above the first region, a concentration of Fe in the second region being lower than a concentration of Fe in the first region.

9 Claims, 14 Drawing Sheets

SECOND EMBODIMENT

100nm

REFERENCE EXAMPLE

100nm

US 9,997,594 B2

GALLIUM NITRIDE BASED HIGH ELECTRON MOBILITY TRANSISTOR (GAN-HEMT) DEVICE WITH AN IRON-DOPED CAP LAYER AND METHOD OF MANUFACTURING THE SAME

CROSS-REFERENCE TO RELATED APPLICATION

This application is based upon and claims the benefit of priority of the prior Japanese Patent Application No. 2015-213329, filed on Oct. 29, 2015, the entire contents of which are incorporated herein by reference.

FIELD

The embodiments discussed herein are directed to a compound semiconductor device and a method of manufacturing the same.

BACKGROUND

Two-dimensional electron gas (2DEG) generated in the vicinity of an interface of a channel layer (carrier transit layer) with a barrier layer (carrier supply layer) is used as a carrier in a high electron mobility transistor (HEMT) which contains a gallium nitride (GaN)-based material. The HEMT containing the GaN-based material (GaN-HEMT) is promising for a high-frequency element and a high-voltage element. A cap layer is formed on the barrier layer for improving characteristics such that suppression of current collapse and suppression of gate leakage by relaxing an electric field concentration.

However, the cap layer inevitably contains a donor impurity such as oxygen (O), and leakage current caused by the donor impurity flows. It is possible to offset the donor impurity when iron (Fe), being an acceptor impurity, is contained in the cap layer so as to reduce the leakage current, but the characteristics of the HEMT whose cap layer contains Fe are difficult to be stabilized.

Patent Literature 1: Japanese Laid-Open Patent Publication No. 2012-28706

Patent Literature 2: Japanese Laid-Open Patent Publication No. 2014-72430

SUMMARY

According to an aspect of the embodiments, a compound semiconductor device includes: a GaN-based channel layer; a barrier layer of nitride semiconductor above the channel layer; and a cap layer of nitride semiconductor above the barrier layer, wherein the cap layer includes: a first region doped with Fe; and a second region above the first region, a concentration of Fe in the second region being lower than a concentration of Fe in the first region.

According to another aspect of the embodiments, a method of manufacturing a compound semiconductor device includes: forming a barrier layer of nitride semiconductor above a GaN-based channel layer; and forming a cap layer of nitride semiconductor above the barrier layer, wherein the forming the cap layer includes: forming a first region with introducing Fe into the first region; and forming a second region above the first region, a concentration of Fe in the second region being lower than a concentration of Fe in the first region.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The inventors of the present application repeatedly conducted earnest studies for finding out the cause of the difficulty of stabilizing the characteristics of the conventional HEMT whose cap layer contains Fe. As a result of this, it was clarified that Fe is easily diffused to a surface side during growth of the cap layer, which deteriorates surface morphology of the cap layer, resulting in that contact resistance of an electrode is difficult to be stabilized. It was also clarified that, as a cause of easiness of the diffusion of Fe to the surface side, an ionic radius of Fe is larger than an ionic radius of Ga, so that the introduced Fe is difficult to enter the Ga site and is easily remained on the surface side. As a result of further earnest studies repeatedly conducted by the inventors of the present application based on such findings, the inventors of the present application arrived at the following various embodiments.

Hereinafter, embodiments will be concretely described while referring to the attached drawings.

First Embodiment

Figure 1A:
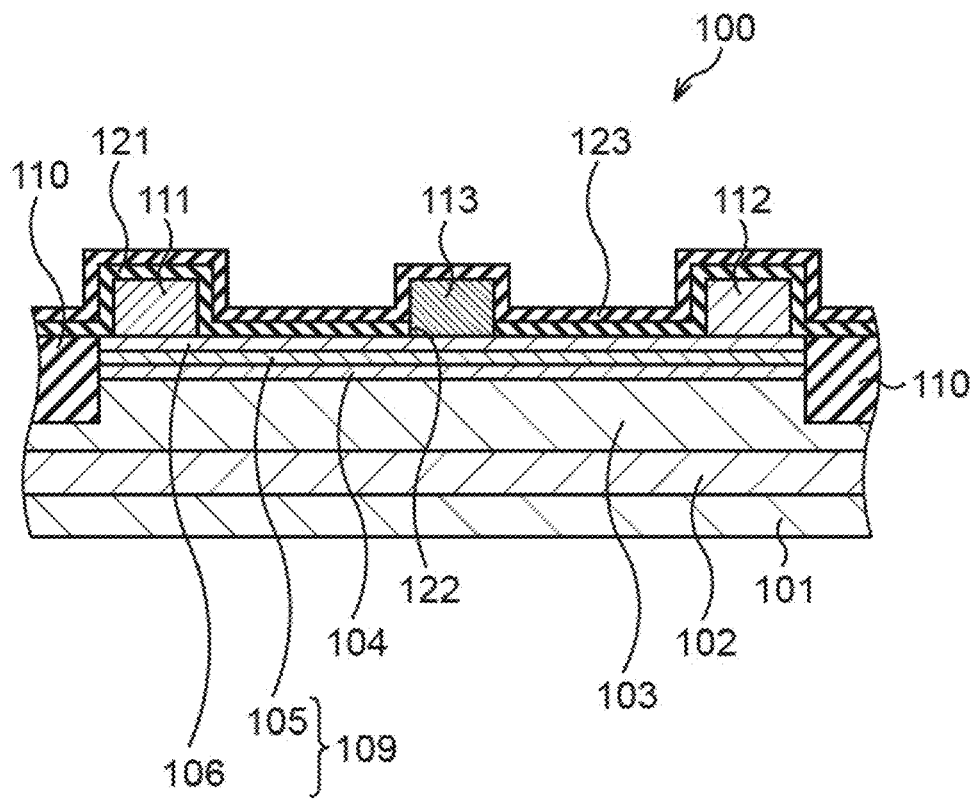
FIG. 1A is a sectional view illustrating a structure of a compound semiconductor device according to a first embodiment.

First, a first embodiment will be described. The first embodiment relates to an example of a compound semiconductor device with HEMT. FIG. 1A is a sectional view illustrating a structure of the compound semiconductor device according to the first embodiment.

As illustrated in FIG. 1A, a compound semiconductor device 100 according to the first embodiment includes a substrate 101, a buffer layer 102 above the substrate 101, and a GaN-based channel layer (carrier transit layer) 103 above the buffer layer 102. The compound semiconductor device 100 also includes a barrier layer (carrier supply layer) 104 of nitride semiconductor above the channel layer 103, and a cap layer 109 of nitride semiconductor above the barrier layer 104.

The substrate 101 is, for example, a silicon carbide (SiC) substrate, a sapphire ($Al_2O_3$) substrate, a silicon (Si) substrate, a GaN substrate, or a zinc oxide (ZnO) substrate. The substrate 101 is preferably a high-resistance substrate in order to suppress leakage current in a thickness direction. The buffer layer 102 is, for example, a GaN layer, an AlN layer, an AlGaN layer, or an InAlGaN layer, and a thickness of the buffer layer 102 is about 1000 nm, for example. The buffer layer 102 may include a plurality of AlGaN layers whose composition changes stepwise, it may include a periodical structure of GaN thin film and AlN thin film (superlattice structure), and it may include a composition in which a proportion of Al continuously changes from AlN to GaN. The buffer layer 102 may include a region containing acceptor impurities such as Fe, magnesium (Mg) and carbon (C). The region containing the acceptor impurities contributes to suppression of leakage current between source and drain electrodes passed through the buffer layer 102 during pinch-off (off leakage). The channel layer 103 is, for example, a GaN layer which has not been intentionally doped with impurity. A thickness of the channel layer 103 is about 30 nm, for example. The barrier layer 104 is of a material which generates two-dimensional electron gas in the channel layer 103, and may be an AlGaN layer whose thickness is about 20 nm, for example. An Al composition of the AlGaN layer is preferably 50% or less, and is more preferably 30% or less. This is for suppressing reduction in crystallinity due to lattice mismatch of the channel layer 103 with GaN. The barrier layer 104 may also be an InAlN layer. The InAlN layer can generate 2DEG in higher concentration than the AlGaN layer. An In composition of the InAlN layer is set to 17%, by which it lattice-matches with GaN, for example.

Figure 1B:
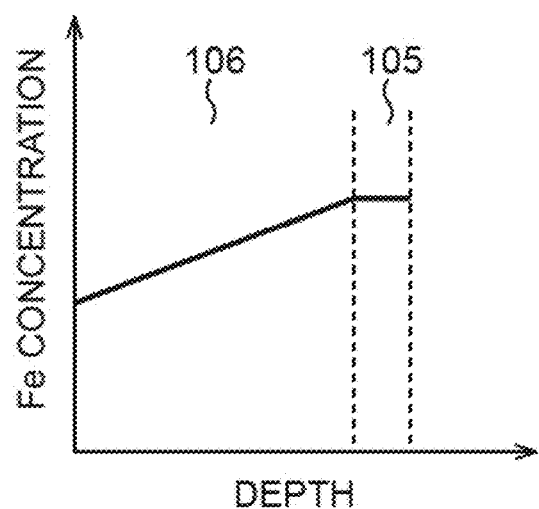
FIG. 1B is a drawing illustrating a relation between a depth from a surface of a cap layer and an Fe concentration in the first embodiment.

As illustrated in FIG. 1A, the cap layer 109 includes a first region 105 doped with Fe, and a second region 106 above the first region 105. The first region 105 is, for example, a GaN layer doped with Fe. A thickness of the first region 105 is about 5 nm, for example. An Fe concentration in the first region 105 is preferably higher than a concentration of inevitably-contained donor impurity, and is $1\times10^{15}$ atoms/$cm^3$ or more, for example. The Fe concentration in the first region 105 is preferably $1\times10^{18}$ atoms/$cm^3$ or less from the viewpoint of crystallinity. The second region 106 is a GaN layer which has not been intentionally doped with impurity, for example, but inevitably contains Fe diffused from the first region 105. A thickness of the second region 106 is about 5 nm, for example. FIG. 1B illustrates a relation between a depth from a surface of the cap layer 109 and the Fe concentration. As illustrated in FIG. 1B, the Fe concentration in the second region 106 is approximately equal to the Fe concentration in the first region 105 at an interface between the second region 106 and the first region 105, and in the second region 106, the farther a position is separated from the first region 105, the lower the Fe concentration is. Thus, the Fe concentration in the second region 106 is lower than the Fe concentration in the first region 105.

An element isolation region 110 demarcating an element region is formed in the stack of the cap layer 109, the barrier layer 104, and the channel layer 103. A source electrode 111 and a drain electrode 112 are formed on the cap layer 109 in the element region.

An insulating film 121 covering the source electrode 111 and the drain electrode 112 is formed on the cap layer 109. An opening 122 is formed between the source electrode 111 and the drain electrode 112 in the insulating film 121, and a gate electrode 113 is formed which is in contact with the cap layer 109 via the opening 122. An insulating film 123 covering the gate electrode 113 is formed on the insulating film 121. A material of the insulating film 121 and the insulating film 123 is not particularly limited, and a silicon nitride film is used, for example.

In the first embodiment, the first region 105 contains the appropriate amount of Fe as an acceptor impurity which offsets the donor impurity, so that the leakage current in the thickness direction can be suppressed, resulting in that good pinch-off characteristic can be obtained. Since the second region 106 is included between the first region 105 and the source electrode 111, drain electrode 112 and gate electrode 113, and the Fe concentration in the second region 106 is lower than the Fe concentration in the first region 105, good surface morphology can be obtained, and stabilized characteristic can be obtained. Therefore, according to the first embodiment, it is possible to obtain the stabilized characteristic while suppressing the leakage current.

The Fe concentration at an upper surface of the second region 106 is preferably $1\times10^{19}$ atoms/$cm^3$ or less. This is for providing particularly excellent surface morphology to the cap layer 109. The thickness of the second region 106 is preferably 5 nm or more. This is because, if the thickness of the second region 106 is less than 5 nm, the Fe concentration at the upper surface of the second region 106 becomes difficult to be $1\times10^{19}$ atoms/$cm^3$ or less, although depending on the Fe concentration in the first region. The thickness of the cap layer 109 is preferably 10 nm or less. This is because, if the thickness of the cap layer 109 exceeds 10 nm, it is difficult to obtain 2DEG with sufficient density.

Next, a method of manufacturing the compound semiconductor device according to the first embodiment will be described. FIG. 2A to FIG. 2G are sectional views illustrating the method of manufacturing the compound semiconductor device according to the first embodiment in order of processes.

Figure 2A:
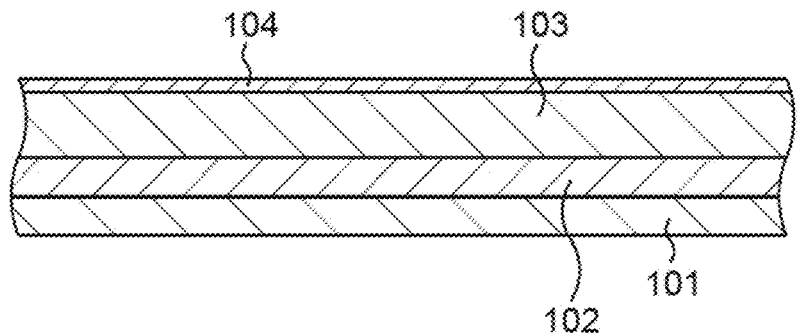
FIG. 2A to FIG. 2G are sectional views illustrating a method of manufacturing the compound semiconductor device according to the first embodiment in order of processes.
Figure 2B:
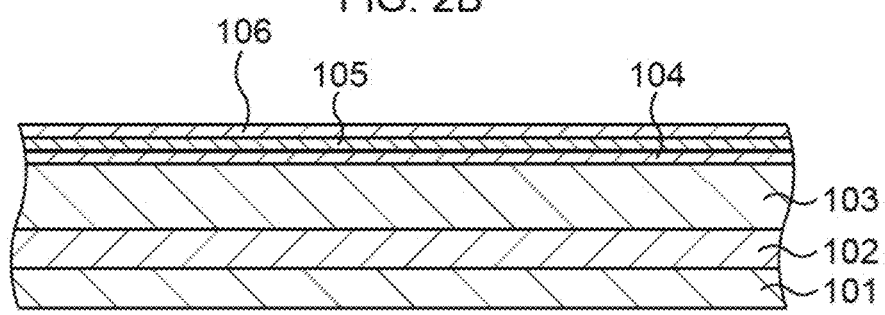

First, the substrate 101 is subjected to heat treatment in $H_2$ atmosphere for a few minutes, and thereafter, as illustrated in FIG. 2A, the buffer layer 102, the channel layer 103, and the barrier layer 104 are formed on the substrate 101. The buffer layer 102, the channel layer 103, and the barrier layer 104 may be formed by a crystal growth method such as a metal organic vapor phase epitaxy (MOVPE) method. Then, as illustrated in FIG. 2B, the first region 105 and the second region 106 are formed on the barrier layer 104. The first region 105 and the second region 106 may also be formed by the crystal growth method such as the MOVPE method.

When these compound semiconductor layers are formed, mixed gas may be used of trimethylaluminum (TMA) gas being an Al source, trimethylgallium (TMG) gas being a Ga source, trimethylindium (TMI) gas being an In source, and ammonia ($NH_3$) gas being an N source, for example. In accordance with the composition of the compound semiconductor layer to be grown, the presence/absence of supply and the flow rate of the trimethylaluminum gas, the trimethylgallium gas, and the trimethylindium gas are appropriately controlled. $H_2$ gas may be used as carrier gas, for example. When the InAlN layer is formed, a growth temperature may be about 800° C., for example.

$Cp_2Fe$ (cyclopentadienyl iron, ferrocene) is used as a source of Fe, for example, in forming the first region 105. Once the formation of the first region 105 is finished, the supply of the source of Fe is stopped, while the supply of the remaining source gas is continued, for example, in forming the second region 106.

Figure 2C:
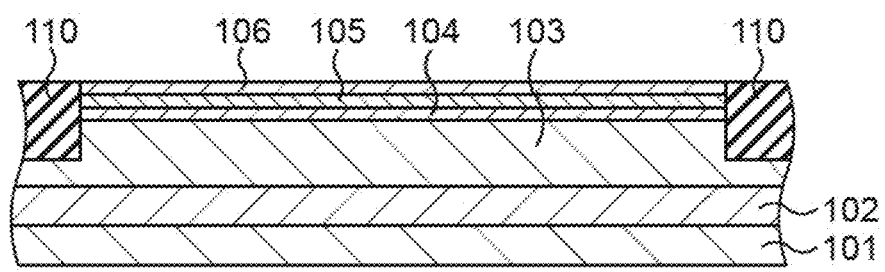

Thereafter, as illustrated in FIG. 2C, the element isolation region 110 demarcating the element region is formed in the second region 106, the first region 105, the barrier layer 104, and the channel layer 103. In the formation of the element isolation region 110, for example, a pattern of photoresist exposing a region in which the element isolation region 110 is to be formed is formed on the second region 106, and ion implantation of Ar is performed while using this pattern as a mask. Dry etching may be performed in which chlorine gas is employed while using this pattern as an etching mask.

Figure 2D:
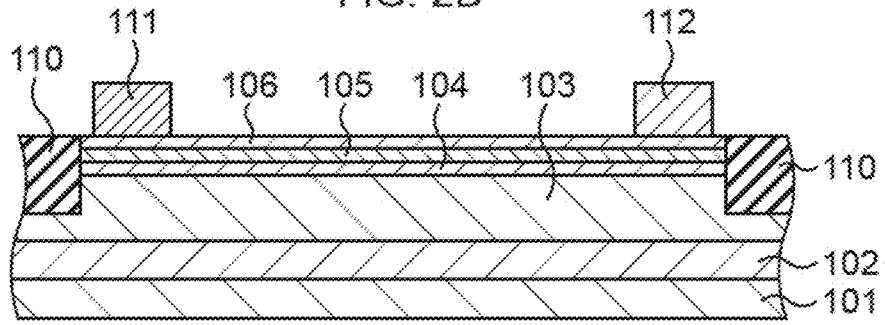

Subsequently, as illustrated in FIG. 2D, the source electrode 111 and the drain electrode 112 are formed on the second region 106 in the element region. The source electrode 111 and the drain electrode 112 may be formed by a lift-off method, for example.

Figure 2E:
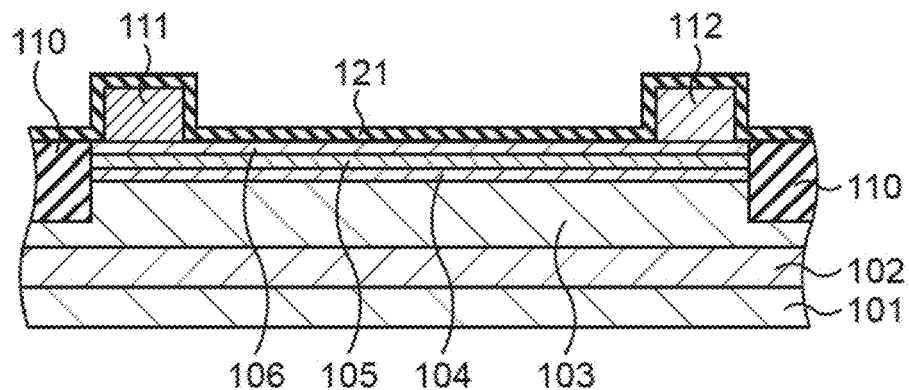

Then, as illustrated in FIG. 2E, the insulating film 121 covering the source electrode 111 and the drain electrode 112 is formed on the second region 106. The insulating film 121 may be formed by a chemical vapor deposition (CVD) method, an atomic layer deposition (ALD) method, or a sputtering method, for example.

Figure 2F:
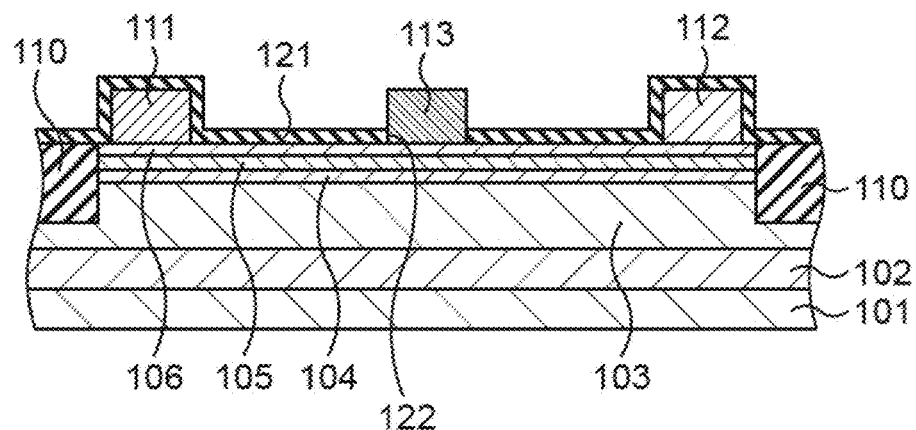

Thereafter, as illustrated in FIG. 2F, the opening 122 is formed in a region of the insulating film 121, in which the gate electrode 113 is to be formed. The opening 122 may be formed by dry etching, for example. The opening 122 may be formed by wet etching or ion milling. Subsequently, the gate electrode 113 is formed in the opening 122. The gate electrode 113 may be formed by the lift-off method, for example.

Figure 2G:
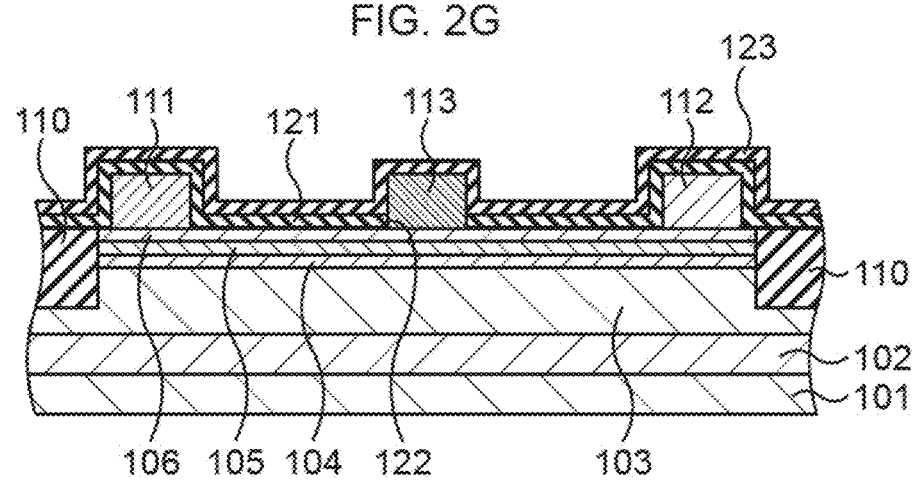

Then, as illustrated in FIG. 2G, the insulating film 123 covering the gate electrode 113 is formed on the insulating film 121. The insulating film 123 may be formed by the CVD method, the ALD method, or the sputtering method, for example, in a similar manner to the insulating film 121.

Then, a protective film, a wiring and the like are formed as necessary to thereby complete the compound semiconductor device 100.

In the formation of the buffer layer 102, conditions such as the growth temperature, a growth pressure, and a source supply ratio (V/III ratio) are preferably controlled so that the channel layer 103 can obtain high crystallinity. Acceptor impurities such as Fe, Mg, and C may be introduced in the middle of the growth of the buffer layer 102. In the formation of the channel layer 103, it is preferable that the growth pressure, the growth temperature, and the V/III ratio are controlled to be higher than those in the formation of the buffer layer 102. An Al composition of the barrier layer 104 is preferably 50% or less, and more preferably 30% or less, from a viewpoint of suppressing the reduction in crystallinity due to the lattice mismatch.

Second Embodiment

Figure 3A:
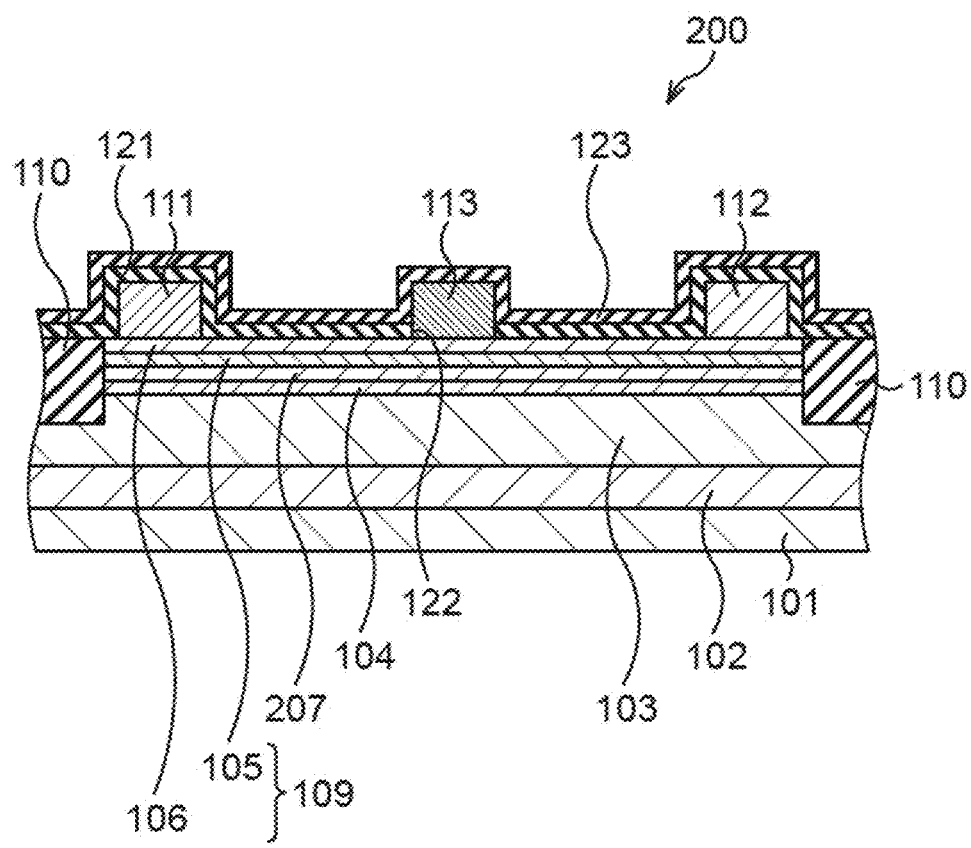
FIG. 3A is a sectional view illustrating a structure of a compound semiconductor device according to a second embodiment.

Next, a second embodiment will be described. The second embodiment relates to another example of a compound semiconductor device with HEMT. FIG. 3A is a sectional view illustrating a structure of the compound semiconductor device according to the second embodiment.

Figure 3B:
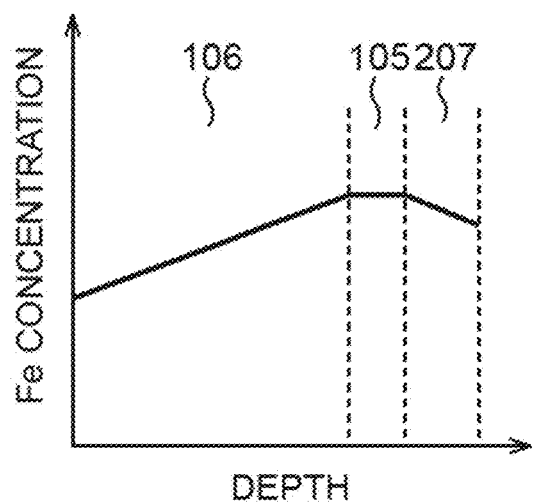
FIG. 3B is a drawing illustrating a relation between a depth from a surface of a cap layer and an Fe concentration in the second embodiment.

As illustrated in FIG. 3A, a compound semiconductor device 200 according to the second embodiment includes a first layer 207 of nitride semiconductor between the barrier layer 104 and the cap layer 109 of the compound semiconductor device 100 according to the first embodiment. The first layer 207 is, for example, an AlN layer, or an AlGaN layer or an InAlN layer having an Al composition higher than that of the barrier layer 104, and inevitably contains Fe diffused from the first region 105. A thickness of the first layer 207 is about 2 nm, for example. FIG. 3B illustrates a relation between a depth from a surface of the cap layer 109 and the Fe concentration, regarding the cap layer 109 and the first layer 207. As illustrated in FIG. 3B, the Fe concentration in the first layer 207 is approximately equal to the Fe concentration in the first region 105 at an interface between the first layer 207 and the first region 105, and in the first layer 207, the farther a position is separated from the first region 105, the lower the Fe concentration is, similarly to the second region 106. Thus, the Fe concentration in the first layer 207 is lower than the Fe concentration in the first region 105. The other configuration is similar to that of the first embodiment.

The second embodiment can also achieve an effect similar to that of the first embodiment. Besides, since the first layer 207 is included between the first region 105 and the barrier layer 104, and the Fe concentration in the first layer 207 is lower than the Fe concentration in the first region 105, a scattering effect due to the diffusion of Fe to the barrier layer 104 is suppressed, resulting in that further excellent electron mobility can be obtained. An Al composition of the first layer 207 is preferably higher than the Al composition of the barrier layer 104. This is because, since the ionic radius of Al is smaller than the ionic radius of Ga, the higher the Al composition is, the further the diffusion of Fe from the first region 105 to the barrier layer 104 is suppressed.

The thickness of the first layer 207 is preferably 0.5 nm or more. This is because, if the thickness of the first layer 207 is less than 0.5 nm, it may be difficult to obtain sufficient effect of improving the electron mobility. The thickness of the first layer 207 is preferably 2 nm or less. This is because, if the thickness of the first layer 207 exceeds 2 nm, a crack may occur due to lattice mismatch between the first layer 207 and the barrier layer 104.

Figure 4A:
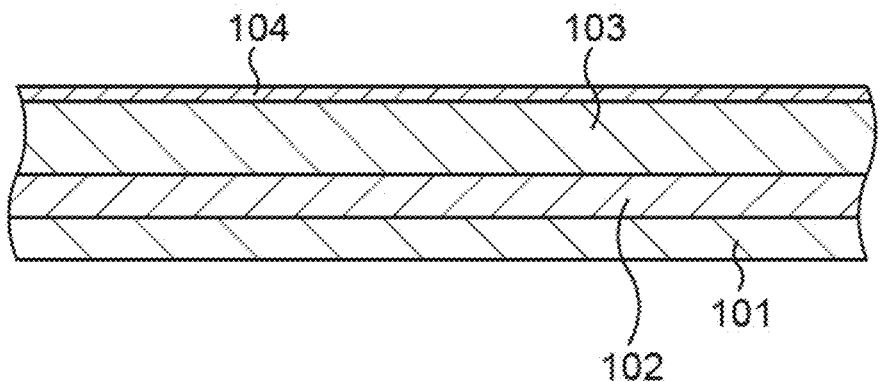
FIG. 4A to FIG. 4C are sectional views illustrating an example of a method of manufacturing the compound semiconductor device according to the second embodiment in order of processes.
Figure 4B:
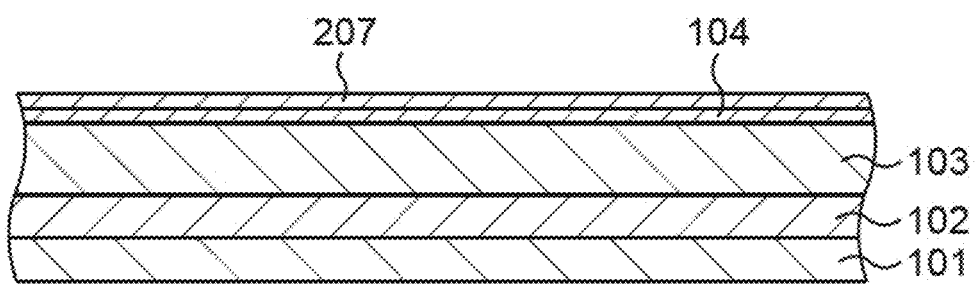
Figure 4C:
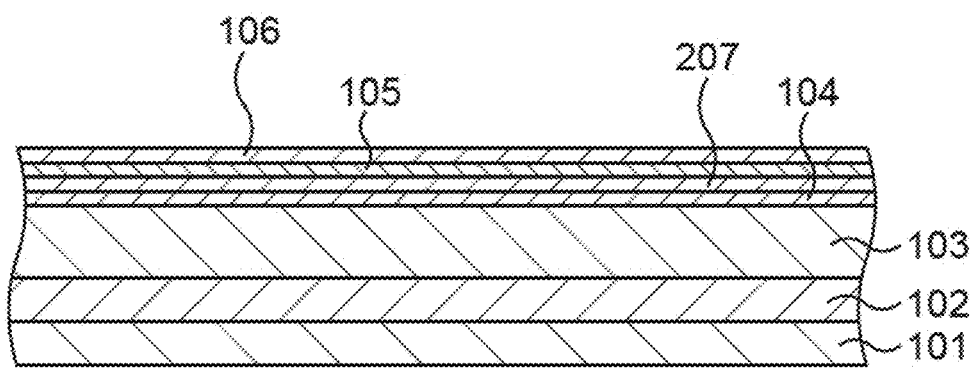

Next, an example of a method of manufacturing the compound semiconductor device according to the second embodiment will be described. FIG. 4A to FIG. 4C are sectional views illustrating the example of the method of manufacturing the compound semiconductor device according to the second embodiment in order of processes.

In this example, as illustrated in FIG. 4A, processing up to the formation of the barrier layer 104 is first conducted, in a similar manner to the first embodiment. Then, as illustrated in FIG. 4B, the first layer 207 is formed on the barrier layer 104. The first layer 207 may be formed by the crystal growth method such as the MOVPE method. In the formation of the first layer 207, a ratio of the flow rate of the trimethylaluminum gas or the trimethylindium gas to the flow rate of the trimethylgallium gas is controlled to be higher than that at the time of forming the barrier layer 104. After the first layer 207 is formed, as illustrated in FIG. 4C, the first region 105 and the second region 106 are formed on the first layer 207, in a similar manner to the first embodiment. Then, processing of the formation of the element isolation region 110 and thereafter is performed, in a similar manner to the first embodiment.

The compound semiconductor device 200 may be manufactured in the manner as described above.

Figure 5A:
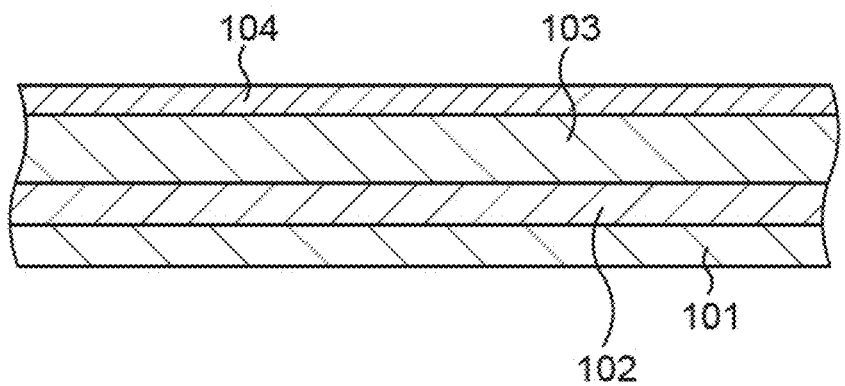
FIG. 5A to FIG. 5C are sectional views illustrating another example of the method of manufacturing the compound semiconductor device according to the second embodiment in order of processes.
Figure 5B:
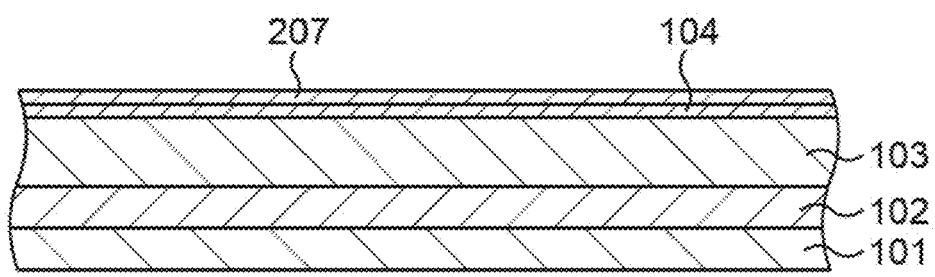
Figure 5C:
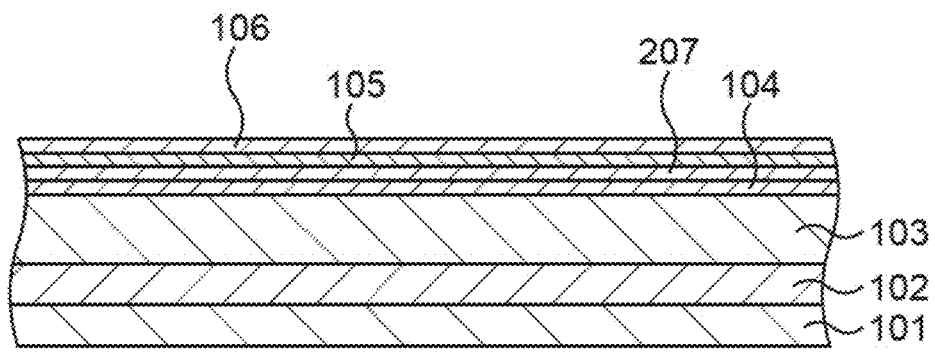

Next, another example of the method of manufacturing the compound semiconductor device according to the second embodiment will be described. FIG. 5A to FIG. 5C are sectional views illustrating another example of the method of manufacturing the compound semiconductor device according to the second embodiment in order of processes.

In this example, as illustrated in FIG. 5A, processing up to the formation of the barrier layer 104 is first conducted, in a similar manner to the first embodiment. The barrier layer 104 is formed preferably to include a thickness greater than that of the first embodiment. Then, as illustrated in FIG. 5B, Ga is thermally desorbed from the surface of the barrier layer 104, thereby forming the first layer 207 whose Al composition is relatively high. After the first layer 207 is formed, as illustrated in FIG. 5C, the first region 105 and the second region 106 are formed on the first layer 207, in a similar manner to the first embodiment. Then, processing of the formation of the element isolation region 110 and thereafter is performed, in a similar manner to the first embodiment.

The compound semiconductor device 200 may be manufactured in the manner as described above.

In the first embodiment and the second embodiment, the second region 106 may contain Al. As the Al composition is high, the diffusion of Fe is further suppressed, resulting in that better surface morphology of the cap layer 109 is easily obtained. However, the Al composition at the upper surface of the second region 106 is preferably low. This is for avoiding deterioration of the surface morphology due to the influence of Al.

Figure 6:
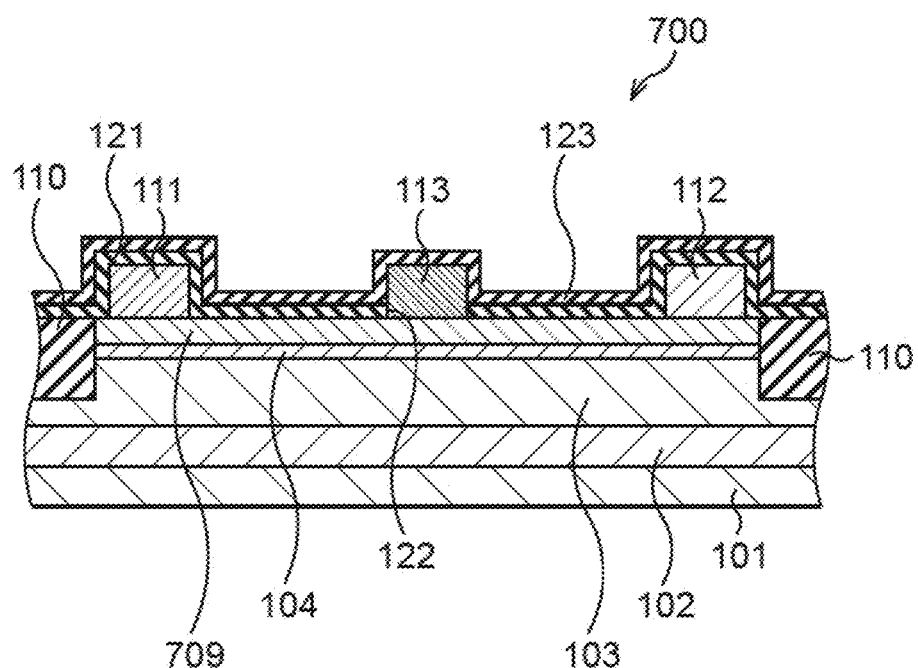
FIG. 6 is a sectional view illustrating a structure of a compound semiconductor device of a reference example.

Next, an experiment conducted by the inventors of the present application and results thereof will be described. In the experiment, the compound semiconductor device 200 according to the second embodiment was manufactured, and a compound semiconductor device 700 being a reference example with a structure illustrated in FIG. 6 was manufactured. In the reference example, as illustrated in FIG. 6, a cap layer 709 was formed of GaN doped with Fe as the same concentration as the first region 105, instead of the first layer 207 and the cap layer 109. Then, the electron mobility in these devices was measured. Results thereof are presented in FIG. 7. Further, before forming the element isolation region 110, surfaces of the cap layer 109 and the cap layer 709 were observed. Results thereof are presented in FIG. 8.

Figure 7:
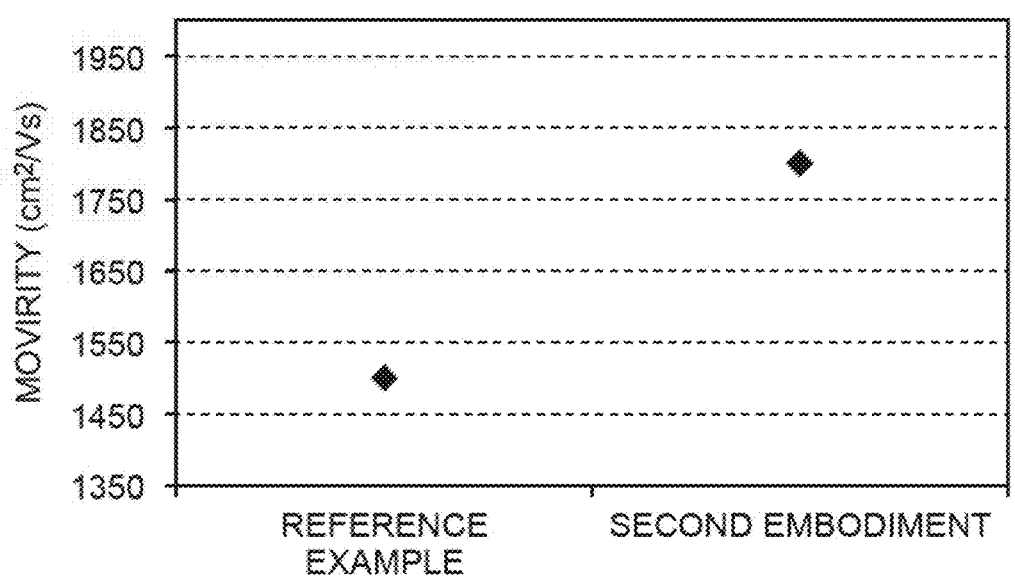
FIG. 7 is a drawing illustrating measurement results of electron mobility.
Figure 8A:
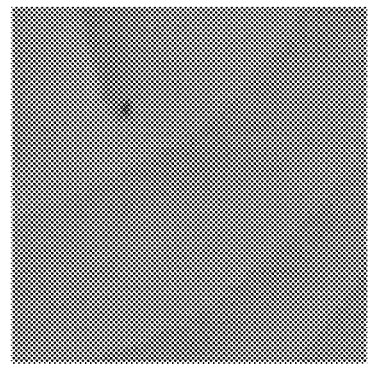
FIG. 8A and FIG. 8B are drawings each illustrating an observation result of a surface of a cap layer.
Figure 8B:
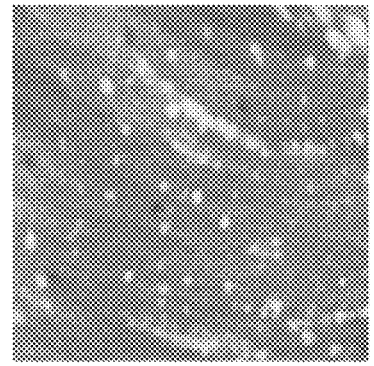

As illustrated in FIG. 7 and FIG. 8, according to the second embodiment, excellent mobility and surface morphology were obtained, based on the comparison with the reference example.

Third Embodiment

Figure 9:
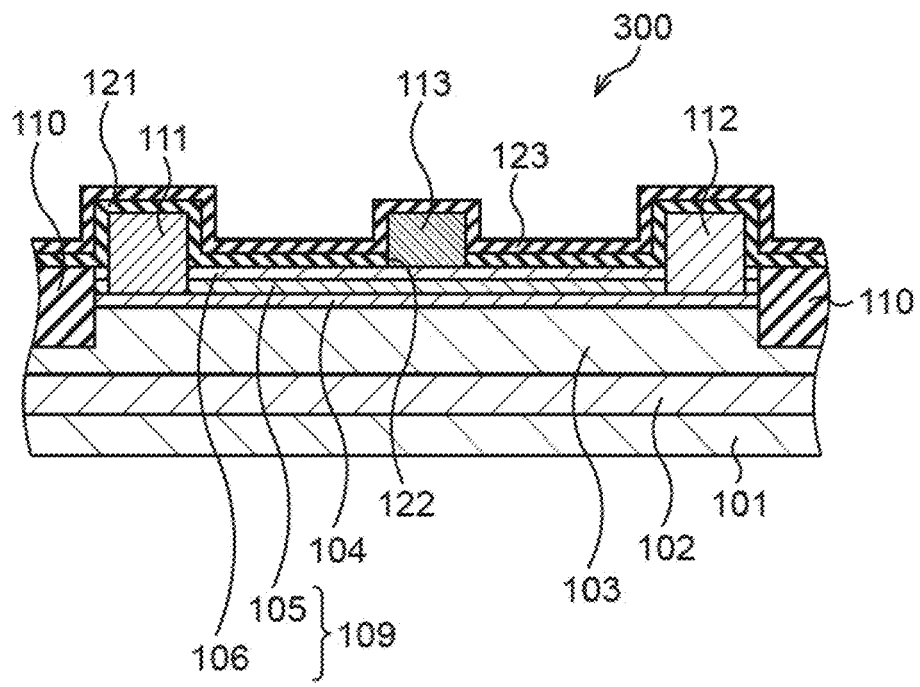
FIG. 9 is a sectional view illustrating a structure of a compound semiconductor device according to a third embodiment.

Next, a third embodiment will be described. The third embodiment relates to another example of a compound semiconductor device with HEMT. FIG. 9 is a sectional view illustrating a structure of the compound semiconductor device according to the third embodiment.

In a compound semiconductor device 300 according to the third embodiment, as illustrated in FIG. 9, an opening for the source electrode 111 and an opening for the drain electrode 112 are formed in the first region 105 and the second region 106. The source electrode 111 and the drain electrode 112 are disposed in these openings, and are in contact with the barrier layer 104. The other configuration is similar to that of the first embodiment.

The third embodiment can also achieve an effect similar to that of the first embodiment. Besides, contact resistance is reduced and an ohmic characteristic is improved, resulting in that a larger current can be obtained.

Fourth Embodiment

Figure 10:
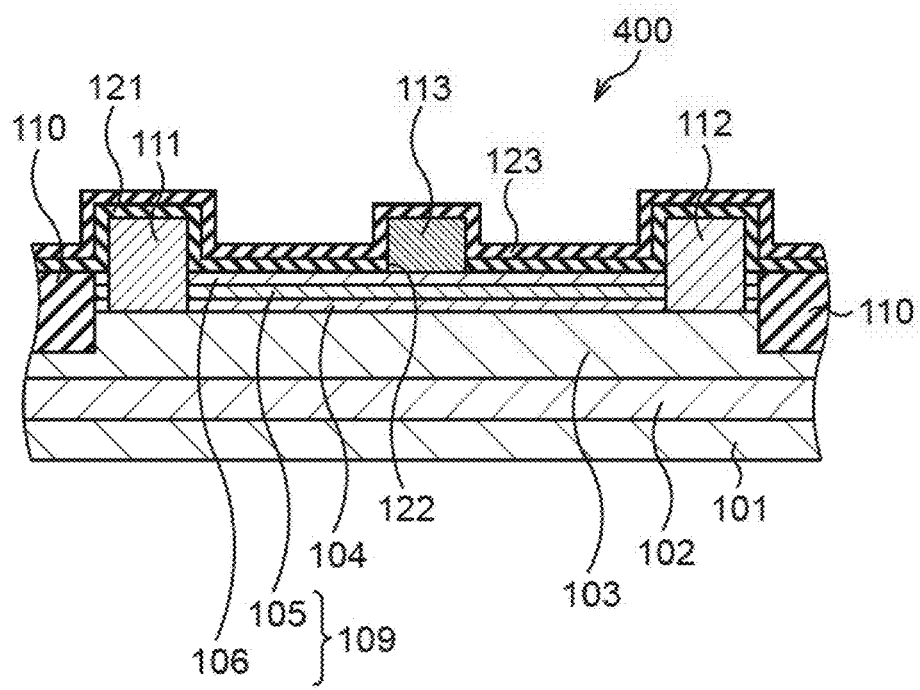
FIG. 10 is a sectional view illustrating a structure of a compound semiconductor device according to a fourth embodiment.

Next, a fourth embodiment will be described. The fourth embodiment relates to another example of a compound semiconductor device with HEMT. FIG. 10 is a sectional view illustrating a structure of the compound semiconductor device according to the fourth embodiment.

In a compound semiconductor device 400 according to the fourth embodiment, as illustrated in FIG. 10, an opening for the source electrode 111 and an opening for the drain electrode 112 are formed in the barrier layer 104, the first region 105, and the second region 106. The source electrode 111 and the drain electrode 112 are disposed in these openings, and are in contact with the channel layer 103. The other configuration is similar to that of the first embodiment.

The fourth embodiment can also achieve an effect similar to that of the first embodiment. Besides, the contact resistance is reduced and the ohmic characteristic is improved, resulting in that a larger current can be obtained.

Fifth Embodiment

Figure 11:
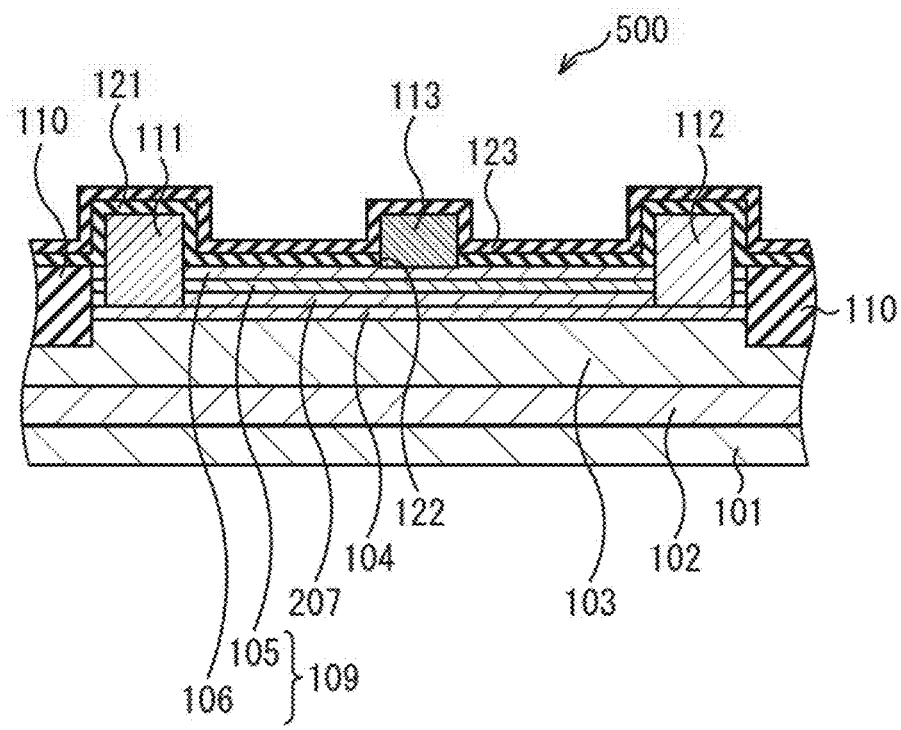
FIG. 11 is a sectional view illustrating a structure of a compound semiconductor device according to a fifth embodiment.

Next, a fifth embodiment will be described. The fifth embodiment relates to another example of a compound semiconductor device with HEMT. FIG. 11 is a sectional view illustrating a structure of the compound semiconductor device according to the fifth embodiment.

In a compound semiconductor device 500 according to the fifth embodiment, as illustrated in FIG. 11, an opening for the source electrode 111 and an opening for the drain electrode 112 are formed in the first layer 207, the first region 105, and the second region 106. The source electrode 111 and the drain electrode 112 are disposed in these openings, and are in contact with the barrier layer 104. The other configuration is similar to that of the second embodiment.

The fifth embodiment can also achieve an effect similar to that of the second embodiment. Besides, the contact resistance is reduced and the ohmic characteristic is improved, resulting in that a larger current can be obtained.

Sixth Embodiment

Figure 12:
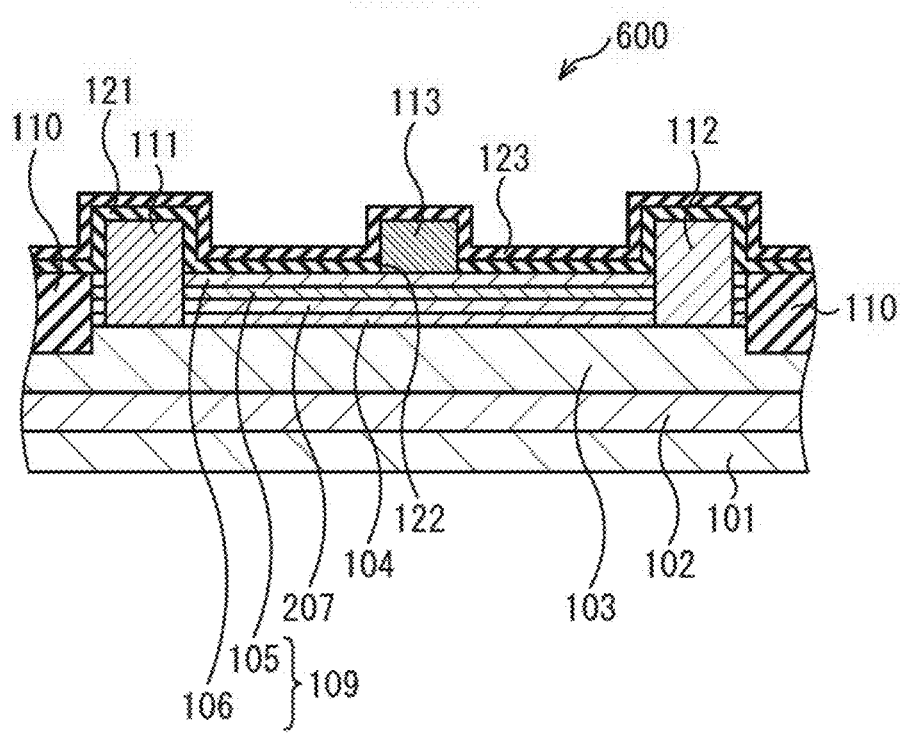
FIG. 12 is a sectional view illustrating a structure of a compound semiconductor device according to a sixth embodiment.

Next, a sixth embodiment will be described. The sixth embodiment relates to another example of a compound semiconductor device with HEMT. FIG. 12 is a sectional view illustrating a structure of the compound semiconductor device according to the sixth embodiment.

In a compound semiconductor device 600 according to the sixth embodiment, as illustrated in FIG. 12, an opening for the source electrode 111 and an opening for the drain electrode 112 are formed in the barrier layer 104, the first layer 207, the first region 105, and the second region 106. The source electrode 111 and the drain electrode 112 are disposed in these openings, and are in contact with the channel layer 103. The other configuration is similar to that of the second embodiment.

The sixth embodiment can also achieve an effect similar to that of the second embodiment. Besides, the contact resistance is reduced and the ohmic characteristic is improved, resulting in that a larger current can be obtained.

In the first embodiment or the second embodiment, a spacer layer may be included between the channel layer 103 and the barrier layer 104, and in this case, the source electrode 111 and the drain electrode 112 may be formed to be in contact with the spacer layer.

Seventh Embodiment

Figure 13:
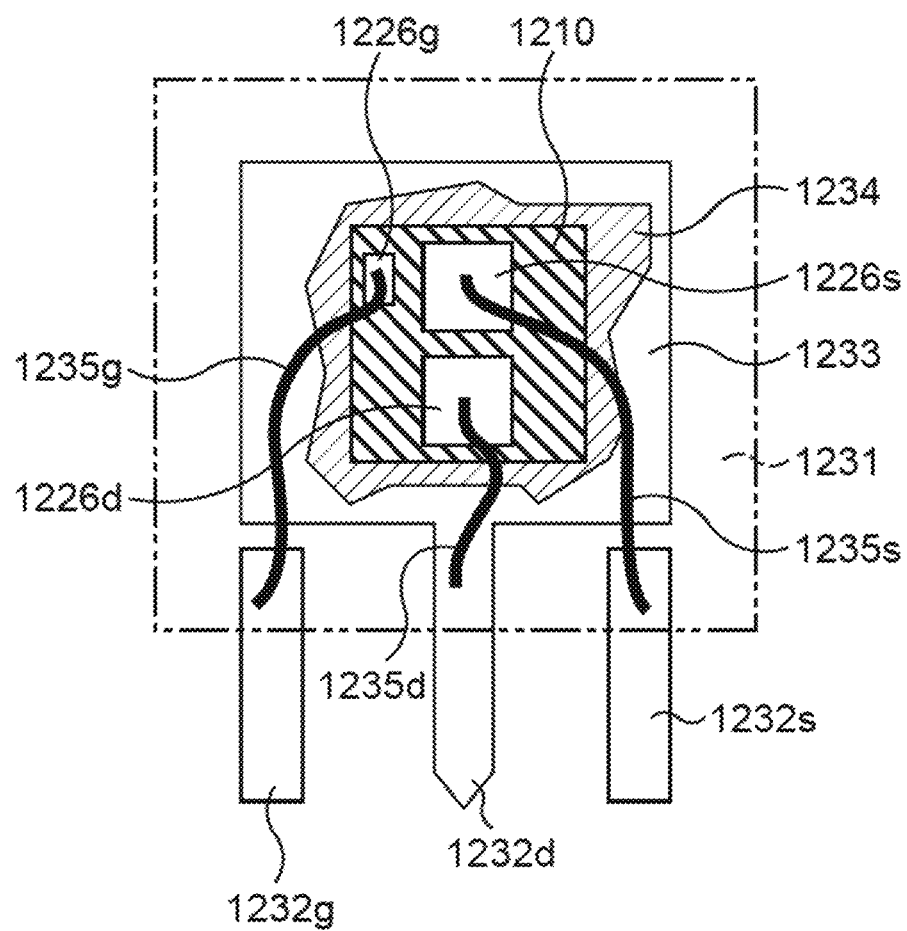
FIG. 13 is a view illustrating a discrete package according to a seventh embodiment.

Next, a seventh embodiment is described. The seventh embodiment relates to a discrete package of a compound semiconductor device which includes a GaN-based HEMT. FIG. 13 is a view illustrating the discrete package according to the seventh embodiment.

In the seventh embodiment, as illustrated in FIG. 13, a back surface of a HEMT chip 1210 of the compound semiconductor device according to any one of the first to sixth embodiments is fixed on a land (die pad) 1233, using a die attaching agent 1234 such as solder. One end of a wire 1235d such as an Al wire is bonded to a drain pad 1226d, to which the drain electrode 112 is connected, and the other end of the wire 1235d is bonded to a drain lead 1232d integral with the land 1233. One end of a wire 1235s such as an Al wire is bonded to a source pad 1226s, to which the source electrode 111 is connected, and the other end of the wire 1235s is bonded to a source lead 1232s separated from the land 1233. One end of a wire 1235g such as an Al wire is bonded to a gate pad 1226g, to which the gate electrode 113 is connected, and the other end of the wire 1235g is bonded to a gate lead 1232g separated from the land 1233. The land 1233, the HEMT chip 1210 and so forth are packaged with a molding resin 1231, so as to project outwards a portion of the gate lead 1232g, a portion of the drain lead 1232d, and a portion of the source lead 1232s.

The discrete package may be manufactured by the procedures below, for example. First, the HEMT chip 1210 is bonded to the land 1233 of a lead frame, using a die attaching agent 1234 such as solder. Next, with the wires 1235g, 1235d and 1235s, the gate pad 1226g is connected to the gate lead 1232g of the lead frame, the drain pad 1226d is connected to the drain lead 1232d of the lead frame, and the source pad 1226s is connected to the source lead 1232s of the lead frame, respectively, by wire bonding. The molding with the molding resin 1231 is conducted by a transfer molding process. The lead frame is then cut away.

Eighth Embodiment

Figure 14:
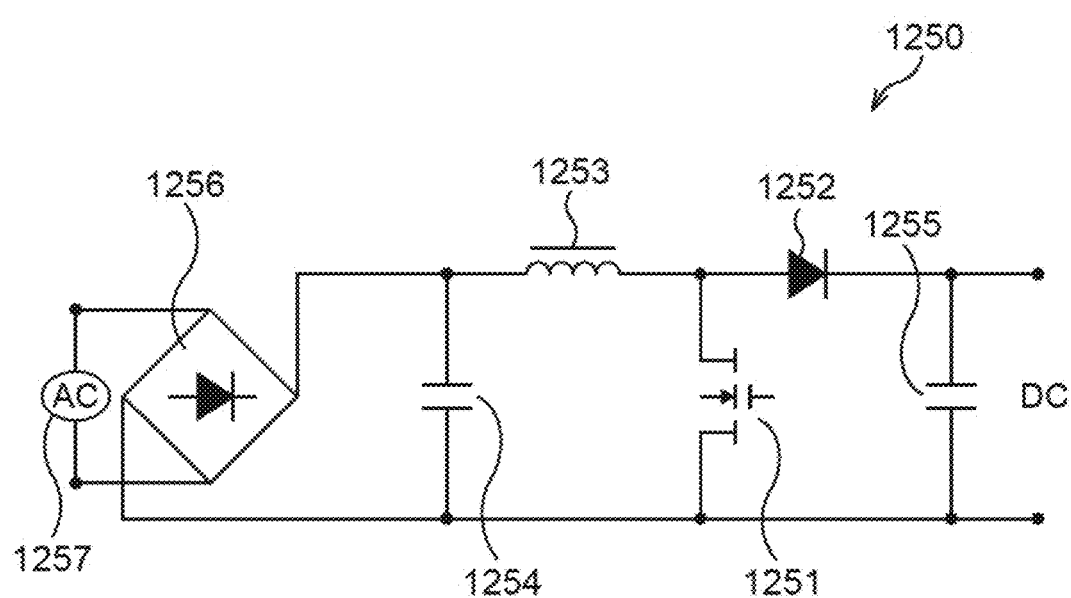
FIG. 14 is a wiring diagram illustrating a PFC circuit according to an eighth embodiment.

Next, an eighth embodiment is described. The eighth embodiment relates to a PFC (power factor correction) circuit equipped with a compound semiconductor device which includes a GaN-based HEMT. FIG. 14 is a wiring diagram illustrating the PFC circuit according to the eighth embodiment.

A PFC circuit 1250 has a switching element (transistor) 1251, a diode 1252, a choke coil 1253, capacitors 1254 and 1255, a diode bridge 1256, and an AC power source (AC) 1257. The drain electrode of the switching element 1251, the anode terminal of the diode 1252, and one terminal of the choke coil 1253 are connected with each other. The source electrode of the switching element 1251, one terminal of the capacitor 1254, and one terminal of the capacitor 1255 are connected with each other. The other terminal of the capacitor 1254 and the other terminal of the choke coil 1253 are connected with each other. The other terminal of the capacitor 1255 and the cathode terminal of the diode 1252 are connected with each other. A gate driver is connected to the gate electrode of the switching element 1251. The AC 1257 is connected between both terminals of the capacitor 1254 via the diode bridge 1256. A DC power source (DC) is connected between both terminals of the capacitor 1255. In the embodiment, the compound semiconductor device according to any one of the first to sixth embodiments is used as the switching element 1251.

In the method of manufacturing the PFC circuit 1250, for example, the switching element 1251 is connected to the diode 1252, the choke coil 1253 and so forth with solder, for example.

Ninth Embodiment

Figure 15:
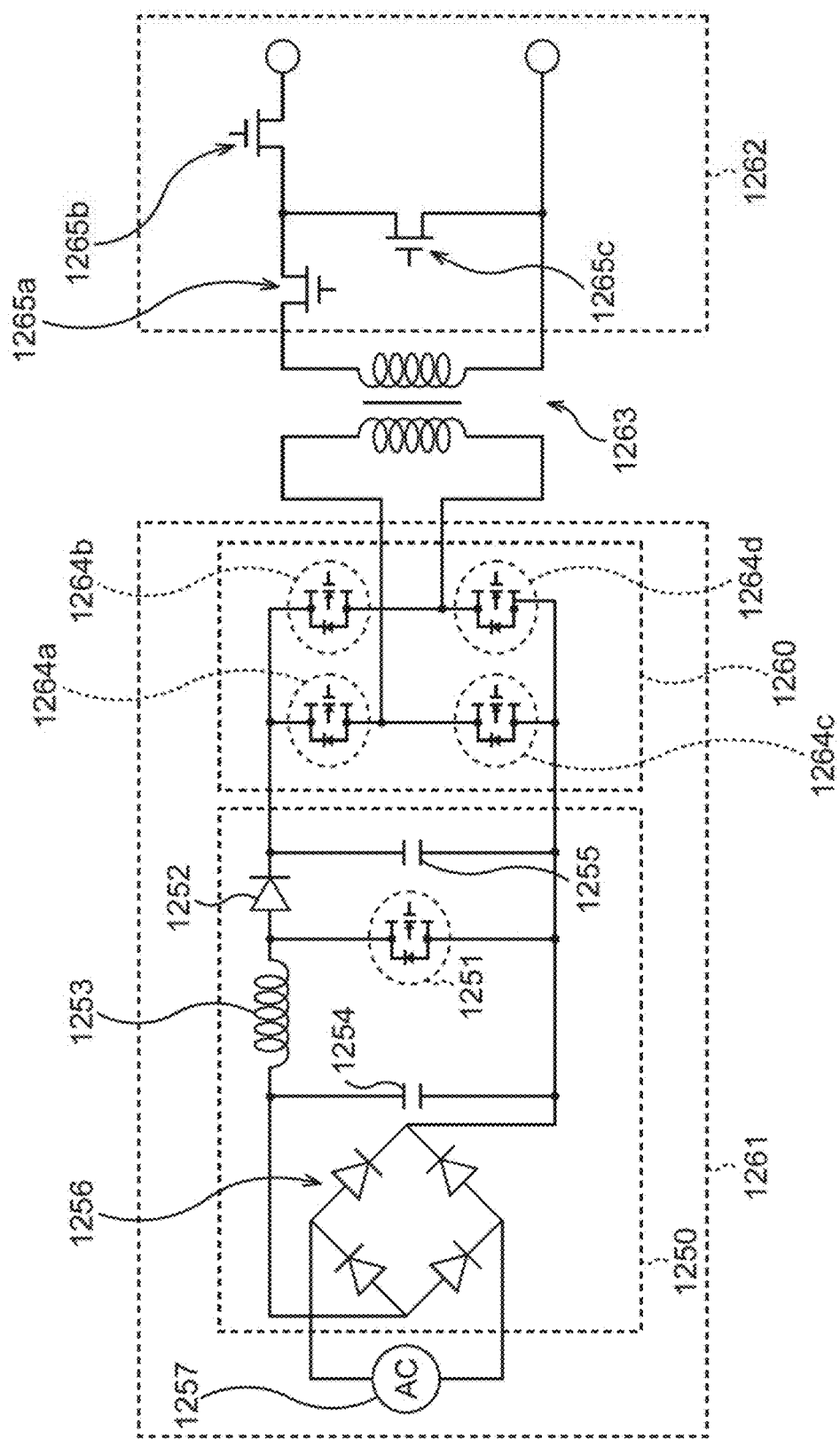
FIG. 15 is a wiring diagram illustrating a power supply apparatus according to a ninth embodiment.

Next, a ninth embodiment is described. The ninth embodiment relates to a power supply apparatus equipped with a compound semiconductor device which includes a GaN-based HEMT. FIG. 15 is a wiring diagram illustrating the power supply apparatus according to the ninth embodiment.

The power supply apparatus includes a high-voltage, primary-side circuit 1261, a low-voltage, secondary-side circuit 1262, and a transformer 1263 arranged between the primary-side circuit 1261 and the secondary-side circuit 1262.

The primary-side circuit 1261 includes the PFC circuit 1250 according to the eighth embodiment, and an inverter circuit, which may be a full-bridge inverter circuit 1260, for example, connected between both terminals of the capacitor 1255 in the PFC circuit 1250. The full-bridge inverter circuit 1260 includes a plurality of (four, in the embodiment) switching elements 1264a, 1264b, 1264c and 1264d.

The secondary-side circuit 1262 includes a plurality of (three, in the embodiment) switching elements 1265a, 1265b and 1265c.

In the embodiment, the compound semiconductor device according to any one of first to sixth embodiments is used for the switching element 1251 of the PFC circuit 1250, and for the switching elements 1264a, 1264b, 1264c and 1264d of the full-bridge inverter circuit 1260. The PFC circuit 1250 and the full-bridge inverter circuit 1260 are components of the primary-side circuit 1261. On the other hand, a silicon-based general MIS-FET (field effect transistor) is used for the switching elements 1265a, 1265b and 1265c of the secondary-side circuit 1262.

Tenth Embodiment

Figure 16:
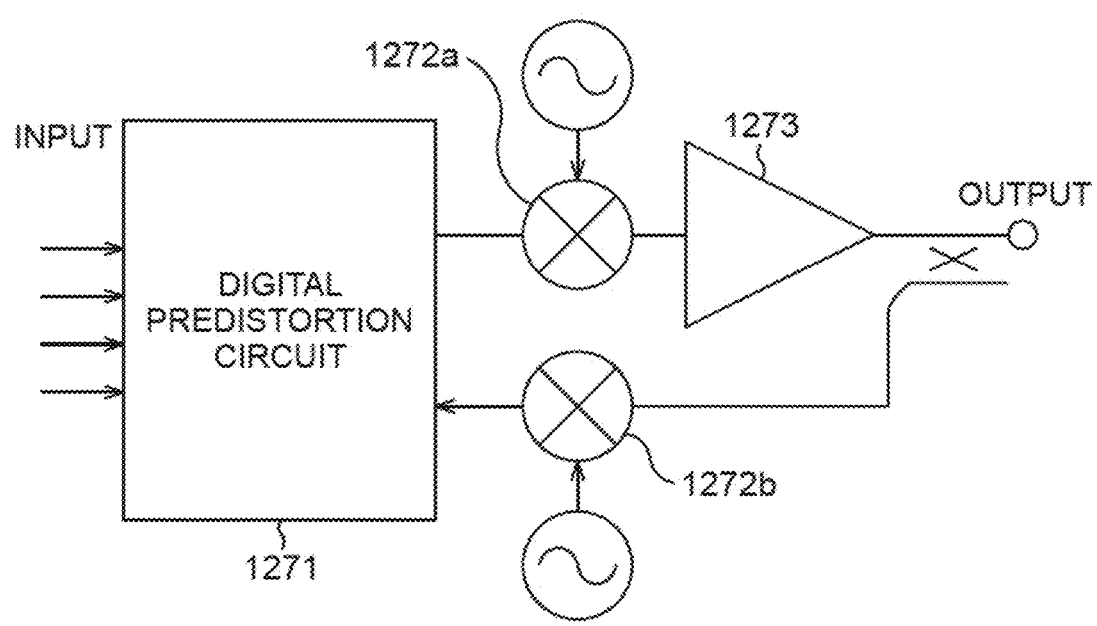
FIG. 16 is a wiring diagram illustrating an amplifier according to a tenth embodiment.

Next, a tenth embodiment is explained. The tenth embodiment relates to an amplifier equipped with the compound semiconductor device which includes a GaN-based HEMT. FIG. 16 is a wiring diagram illustrating the amplifier according to the tenth embodiment.

The amplifier includes a digital predistortion circuit 1271, mixers 1272a and 1272b, and a power amplifier 1273.

The digital predistortion circuit 1271 compensates non-linear distortion in input signals. The mixer 1272a mixes the input signal having the non-linear distortion already compensated, with an AC signal. The power amplifier 1273 includes the compound semiconductor device according to any one of the first to sixth embodiments, and amplifies the input signal mixed with the AC signal. In the embodiment, the signal on the output side may be mixed, upon switching, with an AC signal by the mixer 1272b, and may be sent back to the digital predistortion circuit 1271. The amplifier may be used as a high-frequency amplifier or a high-output amplifier. The high-frequency amplifier may be used for a transmitting and receiving apparatus for cellar-phone base station, a radar apparatus, or for a micro-wave generating apparatus.

According to the above-described compound semiconductor device and the like, since a cap layer includes an appropriate second region, it is possible to suppress the leakage current caused by a donor impurity contained in the cap layer, while obtaining the stabilized characteristics.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
a GaN-based channel layer;
a barrier layer of nitride semiconductor above the channel layer;
a cap layer of nitride semiconductor above the barrier layer, the cap layer including:
a first region doped with Fe; and
a second region above the first region, a concentration of Fe in the second region being lower than a concentration of Fe in the first region; and
a first layer of nitride semiconductor between the barrier layer and the cap layer, a concentration of Fe in the first layer being lower than the concentration of Fe in the first region, wherein
a proportion of Al in the first layer is higher than a proportion of Al in the barrier layer.

2. The compound semiconductor device according to claim 1, wherein, in the second region, the farther a position is separated from the first region, the lower the concentration of Fe.

3. The compound semiconductor device according to claim 1, wherein the concentration of Fe in the first region is $1 \times 10^{15}$ atoms/cm$^3$ or more.

4. The compound semiconductor device according to claim 1, wherein the concentration of Fe at an upper surface of the second region is $1 \times 10^{19}$ atoms/cm$^3$ or less.

5. A power supply apparatus, comprising
a compound semiconductor device, wherein the compound semiconductor device comprises:
a GaN-based channel layer;
a barrier layer of nitride semiconductor above the channel layer;
a cap layer of nitride semiconductor above the barrier layer, the cap layer including:
a first region doped with Fe; and
a second region above the first region, a concentration of Fe in the second region being lower than a concentration of Fe in the first region; and
a first layer of nitride semiconductor between the barrier layer and the cap layer, a concentration of Fe in the first layer being lower than the concentration of Fe in the first region, wherein
a proportion of Al in the first layer is higher than a proportion of Al in the barrier layer.

6. An amplifier, comprising
a compound semiconductor device, wherein the compound semiconductor device comprises:
a GaN-based channel layer;
a barrier layer of nitride semiconductor above the channel layer;
a cap layer of nitride semiconductor above the barrier layer, the cap layer including:
a first region doped with Fe; and
a second region above the first region, a concentration of Fe in the second region being lower than a concentration of Fe in the first region; and
a first layer of nitride semiconductor between the barrier layer and the cap layer, a concentration of Fe in the first layer being lower than the concentration of Fe in the first region, wherein
a proportion of Al in the first layer is higher than a proportion of Al in the barrier layer.

7. A method of manufacturing a compound semiconductor device, comprising:
forming a barrier layer of nitride semiconductor above a GaN-based channel layer;
forming a cap layer of nitride semiconductor above the barrier layer, the forming the cap layer including:
forming a first region with introducing Fe into the first region; and
forming a second region above the first region, a concentration of Fe in the second region being lower than a concentration of Fe in the first region; and
forming a first layer of nitride semiconductor above the barrier layer, a concentration of Fe in the first layer being lower than the concentration of Fe in the first region, between the forming the barrier layer and the forming the cap layer, wherein
a proportion of Al in the first layer is higher than a proportion of Al in the barrier layer.

8. The method according to claim 7, wherein, in the second region, the farther a position is separated from the first region, the lower the concentration of Fe is.

9. The method according to claim 7, wherein the concentration of Fe in the first region is $1 \times 10^{15}$ atoms/cm$^3$ or more.

* * * * *